(12) United States Patent
Suetsugu et al.

(10) Patent No.: US 8,120,983 B2
(45) Date of Patent: Feb. 21, 2012

(54) SEMICONDUCTOR DEVICE HAVING PLURALITY OF OPERATION MODES

(75) Inventors: Eiji Suetsugu, Chiyoda-ku (JP); Wataru Hayashi, Itami (JP)

(73) Assignee: Mitsubishi Electric Corporation, Tokyo (JP)

( * ) Notice: Subject to any disclaimer, the term of this patent is extended or adjusted under 35 U.S.C. 154(b) by 210 days.

(21) Appl. No.: 12/492,475

(22) Filed: Jun. 26, 2009

(65) Prior Publication Data

US 2010/0172201 A1 Jul. 8, 2010

(30) Foreign Application Priority Data

Jan. 6, 2009 (JP) .................... 2009-000968

(51) Int. Cl.
*G11C 5/14* (2006.01)
(52) U.S. Cl. ........ 365/226; 365/194; 365/205; 365/206; 365/207
(58) Field of Classification Search .................. 365/226, 365/205, 206, 207, 194
See application file for complete search history.

(56) References Cited

U.S. PATENT DOCUMENTS

| | | | |
|---|---|---|---|
| 6,567,309 B2 * | 5/2003 | Tanzawa ................. | 365/185.18 |
| 6,812,682 B2 * | 11/2004 | Hachiya .................... | 323/284 |
| 6,960,905 B2 * | 11/2005 | Chen et al. ................. | 323/283 |
| 6,960,906 B2 * | 11/2005 | Yamashita .................. | 323/285 |
| 7,167,028 B2 * | 1/2007 | Hachiya ..................... | 327/77 |
| 2007/0297238 A1 | 12/2007 | Cho et al. | |
| 2008/0225608 A1 | 9/2008 | Lee et al. | |

FOREIGN PATENT DOCUMENTS

| | | |
|---|---|---|
| JP | 1-171036 | 7/1989 |
| JP | 4-39784 | 2/1992 |
| JP | 5-166391 | 7/1993 |
| JP | 2001-188770 | 7/2001 |
| JP | 2008-152621 | 7/2008 |
| JP | 2008-176393 | 7/2008 |
| KR | 10-0733953 B1 | 6/2007 |
| KR | 10-2008-0084001 A | 9/2008 |

OTHER PUBLICATIONS

Office Action in Korean Application No. 10-2009-0076006, mailed Mar. 20, 2011 (with English translation).
Notice of Allowance issued Sep. 30, 2011 in Korean Patent Application No. 10-2009-0076006 (with English Translation).

* cited by examiner

*Primary Examiner* — Pho M Luu
(74) *Attorney, Agent, or Firm* — Oblon, Spivak, McClelland, Maier & Neustadt, L.L.P.

(57) ABSTRACT

A semiconductor device includes: a first level detecting circuit for detecting a voltage level at a control terminal after a prescribed time period from when a power supply voltage is supplied to a power supply terminal, a control unit for selecting in which operation mode among a plurality of operation modes the semiconductor device operates, based on a result of detection by the first level detecting circuit; and a regulator for generating an internal power supply voltage based on the power supply voltage supplied to the power supply terminal. The first level detecting circuit and the control unit receive the internal power supply voltage as an operating power supply voltage. In an operation mode, among the plurality of operation modes, where a power supply voltage having a level different from that of a power supply voltage in other operation modes is supplied to the power supply terminal, the control unit performs data processing by using the power supply voltage supplied to the power supply terminal.

10 Claims, 4 Drawing Sheets

SEMICONDUCTOR DEVICE HAVING PLURALITY OF OPERATION MODES

BACKGROUND OF THE INVENTION

1. Field of the Invention

The present invention relates to a semiconductor device, and in particular, to a semiconductor device having a plurality of operation modes.

2. Description of the Background Art

In a semiconductor device including a sensor and the like that require initial adjustment, a terminal for mode switching is provided in order to allow switching between a test mode for the initial adjustment and a normal mode for a normal sensing operation from the outside of the semiconductor device. Such a terminal for mode switching is not required after the initial adjustment. Therefore, there is a demand to reduce the number of terminals and to downsize the semiconductor device.

As a technique for reducing the number of terminals in a semiconductor device as described above, Japanese Patent Laying-Open No. 04-039784 (Patent Document 1), for example, discloses a configuration of a microcomputer into which an EPROM storing a program executed by a CPU and data is incorporated and that has, as operation modes, a microcomputer mode where the microcomputer performs a normal operation, a test mode where an operation of the CPU is tested, and an EPROM mode where writing and reading from/to the EPROM is performed. The microcomputer includes: a test/program power supply terminal that has both of a terminal function of switching between the microcomputer mode and the test mode and a terminal function of applying a program voltage for writing to the EPROM, and a control terminal for switching between the test mode and the EPROM mode. The microcomputer mode is selected when the test/program power supply terminal has a first logic level, and the test mode and the EPROM mode are selected when the test/program power supply terminal has a second logic level. Switching between the test mode and the EPROM mode is performed depending on the logic level of the control terminal. Upon switching to the EPROM mode, the program voltage is applied from the test/program power supply terminal.

Furthermore, Japanese Patent Laying-Open No. 01-171036 (Patent Document 2) discloses a configuration of a microcomputer in which a reset terminal is used as a terminal for applying a high-voltage signal for mode switching.

Furthermore, Japanese Patent Laying-Open No. 2008-152621 (Patent Document 3) discloses a configuration of a microcomputer in which a reset terminal is shared by a mode setting signal and a reset signal and an operation mode is specified in accordance with a change in the signal provided to the reset terminal. As a result, it is not necessary to provide a mode setting terminal independently, and the number of terminals in the microcomputer can be reduced.

Furthermore, Japanese Patent Laying-Open No. 05-166391 (Patent Document 4) discloses a configuration in which operation is performed such that, during reading of data, the data is read from a corresponding address of a memory cell array by a read mode signal and an address signal input from an input/output terminal, and the read data is output to the input/output terminal. Operation is performed such that, during writing or rewriting of data, the data from the input/output terminal is written into the corresponding address of the memory cell array by a write mode signal and an address signal input from the input/output terminal. One terminal can serve as a mode control signal input terminal and the input/output terminal, so that the number of terminals is reduced.

Furthermore, Japanese Patent Laying-Open No. 2001-188770 (Patent Document 5) discloses a configuration in which one terminal is shared by a signal line through which a signal is transmitted between an incorporated interface and an external serial memory as well as a corresponding signal line of a bus release request signal line, a bus release acknowledge signal line, an I/O request signal line, and a wait signal line, so that the number of terminals is reduced.

In the configuration disclosed in Patent Document 1, however, a power supply terminal that receives an operating power supply voltage for causing the microcomputer to operate is separately required, in addition to the test/program power supply terminal that receives the program voltage. Eventually, three terminals, that is, the test/program power supply terminal, the control terminal and the power supply terminal are required. Patent Documents 2 to 5 do not disclose a configuration by which such a problem is solved, either.

SUMMARY OF THE INVENTION

The present invention has been made to solve the above-described problems and an object thereof is to provide a semiconductor device in which switching between a plurality of operation modes can be performed from the outside and the number of terminals can be reduced.

A semiconductor device according to an aspect of the present invention is directed to a semiconductor device having a plurality of operation modes, including: a control terminal; a power supply terminal to which a power supply voltage is supplied; a first level detecting circuit for detecting a voltage level at the control terminal after a prescribed time period from when the power supply voltage is supplied to the power supply terminal, a control unit for selecting in which operation mode among the plurality of operation modes the semiconductor device operates, based on a result of detection by the first level detecting circuit; and a regulator for generating an internal power supply voltage based on the power supply voltage supplied to the power supply terminal, the first level detecting circuit and the control unit receiving the internal power supply voltage as an operating power supply voltage, and in an operation mode, among the plurality of operation modes, where a power supply voltage having a level different from that of a power supply voltage in other operation modes is supplied to the power supply terminal, the control unit performing data processing by using the power supply voltage supplied to the power supply terminal.

According to the present invention, switching between the plurality of operation modes can be performed from the outside and the number of terminals can be reduced.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

Figure 1:
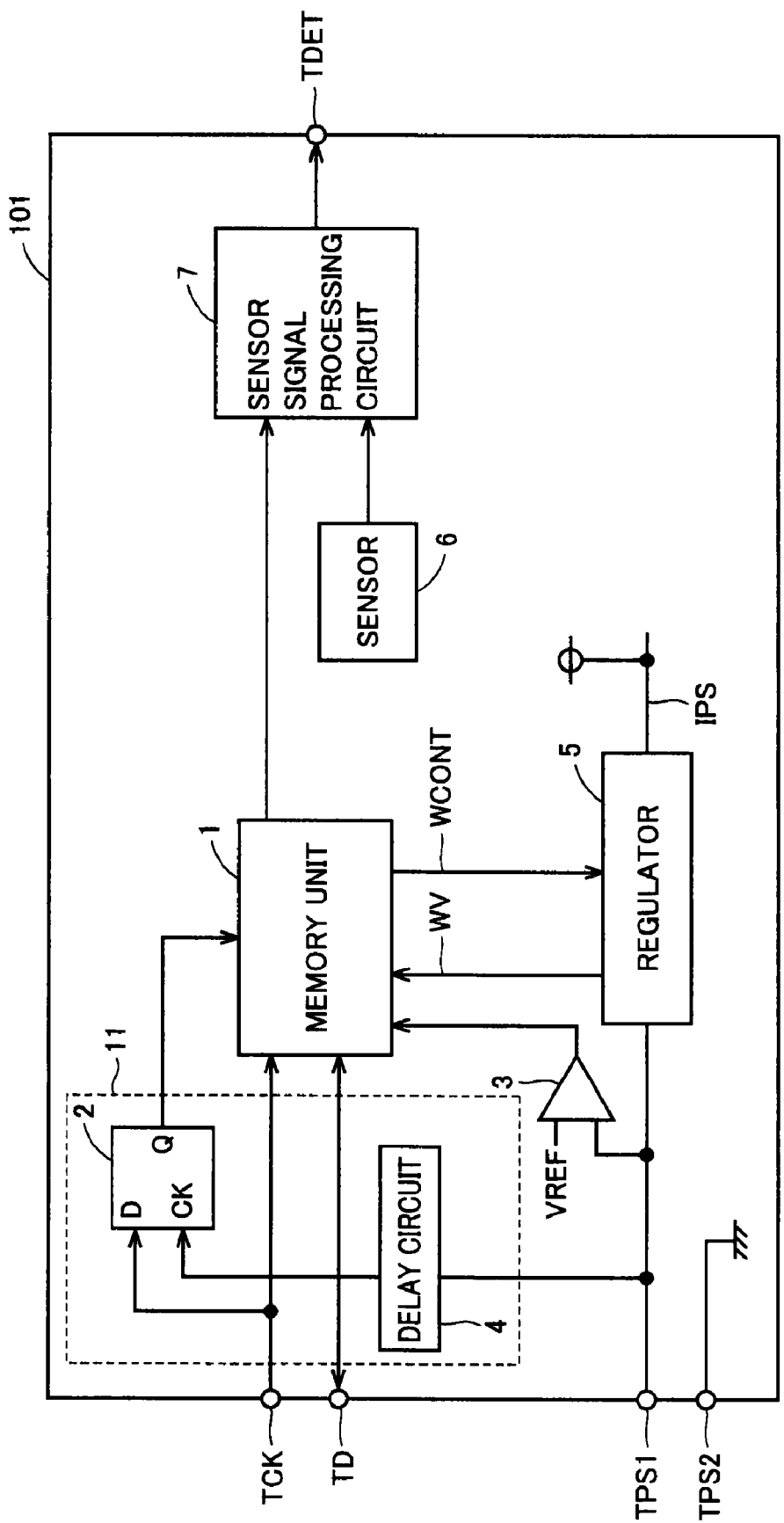
FIG. 1 shows a configuration of a semiconductor device according to a first embodiment of the present invention.

Embodiments of the present invention will be described hereinafter with reference to the drawings. In the drawings, the same or corresponding portions are denoted by the same reference characters, and description thereof will not be repeated.

First Embodiment

[Configuration and Basic Operation]

FIG. 1 shows a configuration of a semiconductor device according to a first embodiment of the present invention.

Referring to FIG. 1, a semiconductor device 101 includes a memory unit (control unit) 1, a level detecting circuit 11, a comparator (level detecting circuit) 3, a regulator 5, a sensor 6, a sensor signal processing circuit 7, a control terminal TCK, a data terminal TD, power supply terminals TPS1 and TPS2, and an output terminal TDET. Level detecting circuit 11 includes a flip flop 2 and a delay circuit 4.

Sensor 6 is, for example, a pressure sensor or an acceleration sensor, and outputs a signal indicating the result of detection to sensor signal processing circuit 7.

Sensor signal processing circuit 7 adjusts the signal received from sensor 6, based on adjustment data received from memory unit 1, and outputs the adjusted signal from output terminal TDET to the outside of semiconductor device 101 as a detection signal. The adjustment data is, for example, an amplification factor and an offset value. Sensor signal processing circuit 7 amplifies the output signal of sensor 6 based on the amplification factor indicated by the adjustment data received from memory unit 1, and provides an offset voltage to the output signal of sensor 6 based on the offset value indicated by this adjustment data.

Regulator 5 generates an internal power supply voltage IPS based on a power supply voltage supplied to power supply terminal TPS1. For example, regulator 5 steps down the power supply voltage of 5V supplied to power supply terminal TPS1, to generate internal power supply voltage IPS of 3.8V. Internal power supply voltage IPS is supplied to each block in semiconductor device 101, such as each block shown in FIG. 1, as an operating power supply voltage. Furthermore, power supply terminal TPS2 is grounded.

[Operation]

Next, an operation when switching between operation modes is performed by the semiconductor device according to the first embodiment of the present invention will be described.

Semiconductor device 101 has a normal mode RM, an adjustment mode TM and a memory write mode WM.

Level detecting circuit 11 detects a voltage level at control terminal TCK immediately after supply of a power supply voltage to power supply terminal TPS1 is initiated, that is, after a prescribed time period from when a power supply voltage is supplied to power supply terminal TPS1.

More specifically, delay circuit 4 delays a signal indicating a level of the power supply voltage supplied to power supply terminal TPS1 by a prescribed time period, and outputs the delayed signal to flip flop 2. A signal indicating the voltage level received by control terminal TCK is provided to flip flop 2. On the rising edge of the signal received from delay circuit 4, flip flop 2 holds the signal received from control terminal TCK, and in addition, outputs the signal to memory unit 1.

Comparator 3 detects the level of the power supply voltage supplied to power supply terminal TPS1. More specifically, comparator 3 compares the power supply voltage supplied to power supply terminal TPS1 and a reference voltage VREF, and outputs a signal indicating the result of comparison to memory unit 1.

Memory unit 1 selects whether semiconductor device 101 operates in normal mode RM or semiconductor device 101 operates in adjustment mode TM or memory write mode WM, based on the result of level detection by flip flop 2. Furthermore, in a case where semiconductor device 101 operates in adjustment mode TM or memory write mode WM, memory unit 1 selects whether semiconductor device 101 operates in adjustment mode TM or semiconductor device 101 operates in memory write mode WM, based on the result of detection by comparator 3.

For example, memory unit 1 selects whether semiconductor device 101 operates in normal mode RM or semiconductor device 101 operates in adjustment mode TM, based on the signal received from flip flop 2. During the operation in adjustment mode TM, memory unit 1 performs switching from adjustment mode TM to memory write mode WM, based on the result of detection by comparator 3. More specifically, during the operation in adjustment mode TM, memory unit 1 performs switching from adjustment mode TM to memory write mode WM when an absolute value of the voltage level detected by flip flop 2 reaches a prescribed value or higher.

Figure 2:
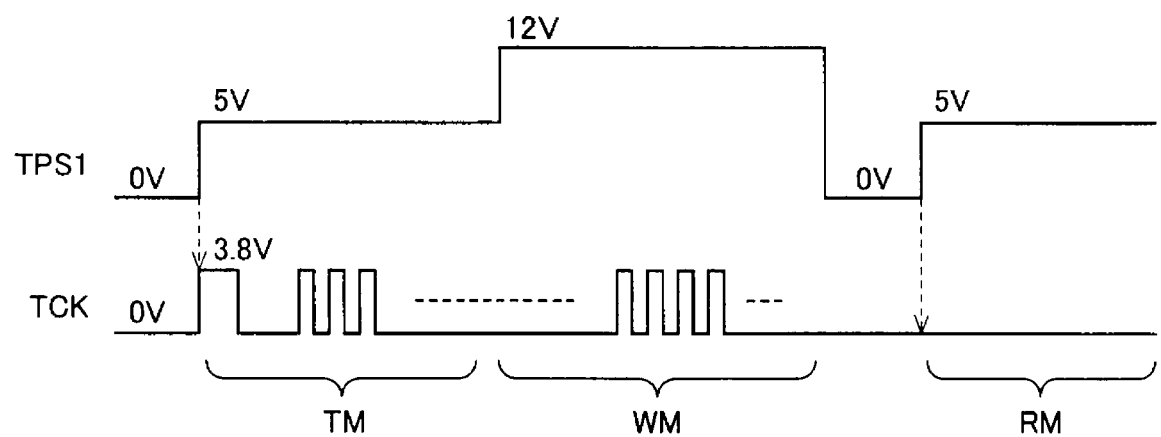
FIG. 2 is a timing chart of an operation when switching between operation modes is performed by the semiconductor device according to the first embodiment of the present invention.

FIG. 2 is a timing chart of an operation when switching between the operation modes is performed by the semiconductor device according to the first embodiment of the present invention.

Referring to FIG. 2, first, the power supply voltage of, for example, 5V is supplied to power supply terminal TPS1, and in addition, the voltage of, for example, 3.8V is supplied to control terminal TCK. At this time, regulator 5 steps down the power supply voltage of 5V supplied to power supply terminal TPS1, to generate internal power supply voltage IPS of 3.8V. Each block in semiconductor device 101 receives internal power supply voltage IPS as the operating power supply voltage.

In this case, the rising edge of the power supply voltage is delayed by delay circuit 4 and conveyed to flip flop 2. On the rising edge conveyed from delay circuit 4, flip flop 2 holds the voltage of 3.8V received from control terminal TCK, and in addition, outputs the voltage to memory unit 1. Then, memory unit 1 selects adjustment mode TM.

Thereafter, a control signal, for example, a reference clock is provided to control terminal TCK from the outside of semiconductor device 101, and the adjustment data is provided to data terminal TD from the outside. Memory unit 1 receives the adjustment data from data terminal TD by using the reference clock from control terminal TCK, and outputs this adjustment data to sensor signal processing circuit 7.

Sensor signal processing circuit 7 adjusts the signal received from sensor 6, based on the adjustment data received from memory unit 1, and outputs the adjusted signal from output terminal TDET to the outside of semiconductor device 101 as a detection signal.

In adjustment mode TM, various adjustment data is provided to data terminal TD from the outside of semiconductor device 101. Optimum adjustment data is obtained while the detection signal output from output terminal TDET is measured outside semiconductor device 101.

Next, the power supply voltage of, for example, 12V that is higher than the power supply voltage in adjustment mode TM and in normal mode RM is supplied to power supply terminal TPS1 as a write voltage. At this time, regulator 5 steps down the power supply voltage of 12V supplied to power supply terminal TPS1, to generate internal power supply voltage IPS of 3.8V. Each block in semiconductor device 101 receives internal power supply voltage IPS as the operating power supply voltage. Furthermore, the control signal, for example, the reference clock is provided to control terminal TCK from the outside of semiconductor device 101.

In this case, comparator 3 compares the power supply voltage of 12V supplied to power supply terminal TPS1 and reference voltage VREF of, for example, 12V, and outputs, to memory unit 1, a signal indicating that the power supply voltage supplied to power supply terminal TPS1 is not lower than reference voltage VREF. Then, memory unit 1 selects memory write mode WM.

Memory unit 1 receives the adjustment data from data terminal TD by using the reference clock from control terminal TCK. This adjustment data is the optimum adjustment data obtained in adjustment mode TM. Then, memory unit 1 outputs a control signal WCONT to regulator 5. In response to control signal WCONT from memory unit 1, a switch included in regulator 5 outputs the write voltage of 12V received through power supply terminal TPS1 to memory unit 1. Memory unit 1 writes the adjustment data into a non-volatile semiconductor storage element within memory unit 1 by using the write voltage of 12V received from regulator 5, thereby storing the adjustment data in a non-volatile manner.

Next, the supply of the power supply voltage to power supply terminal TPS1 is stopped, the supply of the reference clock to control terminal TCK is stopped, the supply of the adjustment data to data terminal TD is stopped, and the voltage of each terminal is set to, for example, 0V. Thereafter, the power supply voltage of, for example, 5V is supplied to power supply terminal TPS1. At this time, regulator 5 steps down the power supply voltage of 5V supplied to power supply terminal TPS1, to generate internal power supply voltage IPS of 3.8V. Each block in semiconductor device 101 receives internal power supply voltage IPS as the operating power supply voltage.

In this case, the rising edge of the power supply voltage is delayed by delay circuit 4 and conveyed to flip flop 2. On the rising edge conveyed from delay circuit 4, flip flop 2 holds the voltage of 0V received from control terminal TCK, and in addition, outputs the voltage to memory unit 1. Then, memory unit 1 selects normal mode RM.

In normal mode RM, memory unit 1 outputs the adjustment data stored in memory write mode WM to sensor signal processing circuit 7.

Sensor signal processing circuit 7 adjusts the signal received from sensor 6, based on the adjustment data received from memory unit 1, and outputs the adjusted signal from output terminal TDET to the outside of semiconductor device 101 as a detection signal.

In the configuration disclosed in Patent Document 1, the power supply terminal that receives the operating power supply voltage for causing the microcomputer to operate is separately required, in addition to the test/program power supply terminal that receives the program voltage. Eventually, three terminals, that is, the test/program power supply terminal, the control terminal and the power supply terminal are required.

In the semiconductor device according to the first embodiment of the present invention, however, flip flop 2 detects a voltage level at control terminal TCK immediately after supply of a power supply voltage to power supply terminal TPS1 is initiated, that is, after a prescribed time period from when a power supply voltage is supplied to power supply terminal TPS1. Comparator 3 detects a level of the power supply voltage supplied to power supply terminal TPS1. Memory unit 1 selects whether the semiconductor device operates in normal mode RM or the semiconductor device operates in adjustment mode TM or memory write mode WM, based on the result of level detection by flip flop 2. In a case where the semiconductor device operates in adjustment mode TM or memory write mode WM, memory unit 1 selects whether the semiconductor device operates in adjustment mode TM or the semiconductor device operates in memory write mode WM, based on the result of detection by comparator 3.

With such a configuration, for example, even if a write voltage that is higher than the power supply voltage in adjustment mode TM and in normal mode RM is supplied to the power supply terminal in memory write mode WM, this write voltage can be stepped down to generate an internal power supply voltage and the generated internal power supply voltage can be supplied to each block. In other words, power supply terminal TPS1 can be used as a terminal for generation of the internal power supply voltage and as a terminal for the write voltage. Therefore, the number of terminals can be reduced. Furthermore, switching between the three operation modes can be performed by two terminals, that is, power supply terminal TPS1 and control terminal TCK. Therefore, the number of terminals can be reduced.

In addition, in the configuration disclosed in Patent Document 1, the program voltage for writing to the EPROM is supplied to the test/program power supply terminal. Therefore, during writing to the EPROM, a control signal for writing to the EPROM cannot be provided to the test/program power supply terminal.

In the semiconductor device according to the first embodiment of the present invention, however, after selection of the operation in adjustment mode TM or memory write mode WM, memory unit 1 performs data processing by using the control signal, that is, the reference clock received through control terminal TCK. More specifically, in adjustment mode TM and in memory write mode WM, memory unit 1 receives the adjustment data from data terminal TD by using the reference clock received through control terminal TCK.

In other words, unlike the configuration disclosed in Patent Document 1, the write voltage is supplied to the power supply terminal in the semiconductor device according to the first embodiment of the present invention. Therefore, in memory write mode WM, the reference clock can be provided to memory unit 1 via control terminal TCK. As a result, it is not necessary to separately provide a terminal for memory write mode WM, and the number of terminals can be reduced.

The semiconductor device according to the first embodiment of the present invention is configured to include level detecting circuit 11 and comparator 3, and to perform switching between the three operation modes, that is, normal mode RM, adjustment mode TM and memory write mode WM, based on the results of level detection by level detecting circuit 11 and comparator 3. The present invention, however, is not limited thereto. Even if the semiconductor device does not include comparator 3, the semiconductor device may only be configured in the following manner. In other words, memory unit 1 selects in which operation mode among the plurality of operation modes the semiconductor device operates, based on the result of detection by level detecting circuit 11. Level detecting circuit 11 and memory unit 1 receive the internal power supply voltage from regulator 5 as the operating power supply voltage. In an operation mode where a power supply voltage having a level different from that of a power supply voltage in other operation modes is supplied to the power supply terminal, among the plurality of operation modes, memory unit 1 uses, as the write voltage, the power supply voltage supplied to the power supply terminal.

Furthermore, in the semiconductor device according to the first embodiment of the present invention, memory unit 1 is configured to store the adjustment data in a non-volatile manner in memory write mode WM by using the write voltage that is higher than the power supply voltage in adjustment mode TM and in normal mode RM. The present invention, however, is not limited thereto. In an operation mode where a power supply voltage having a level different from that of a power supply voltage in other operation modes is supplied to power supply terminal TPS1, memory unit 1 may only be configured to perform some type of data processing by using the power supply voltage supplied to power supply terminal TPS1.

In addition, the semiconductor device according to the first embodiment of the present invention is configured to use the write voltage of 12V and the internal power supply voltage of 3.8V. The present invention, however, is not limited thereto. The write voltage and the internal power supply voltage may be a negative voltage.

Next, another embodiment of the present invention will be described with reference to the drawings. In the drawings, the same or corresponding portions are denoted by the same reference characters, and description thereof will not be repeated.

Second Embodiment

The present embodiment is directed to a semiconductor device in which conditions for switching to the adjustment mode are modified, when compared to the semiconductor device according to the first embodiment. Except for the contents described in the following, the semiconductor device according to the present embodiment is the same as that of the first embodiment.

Figure 3:
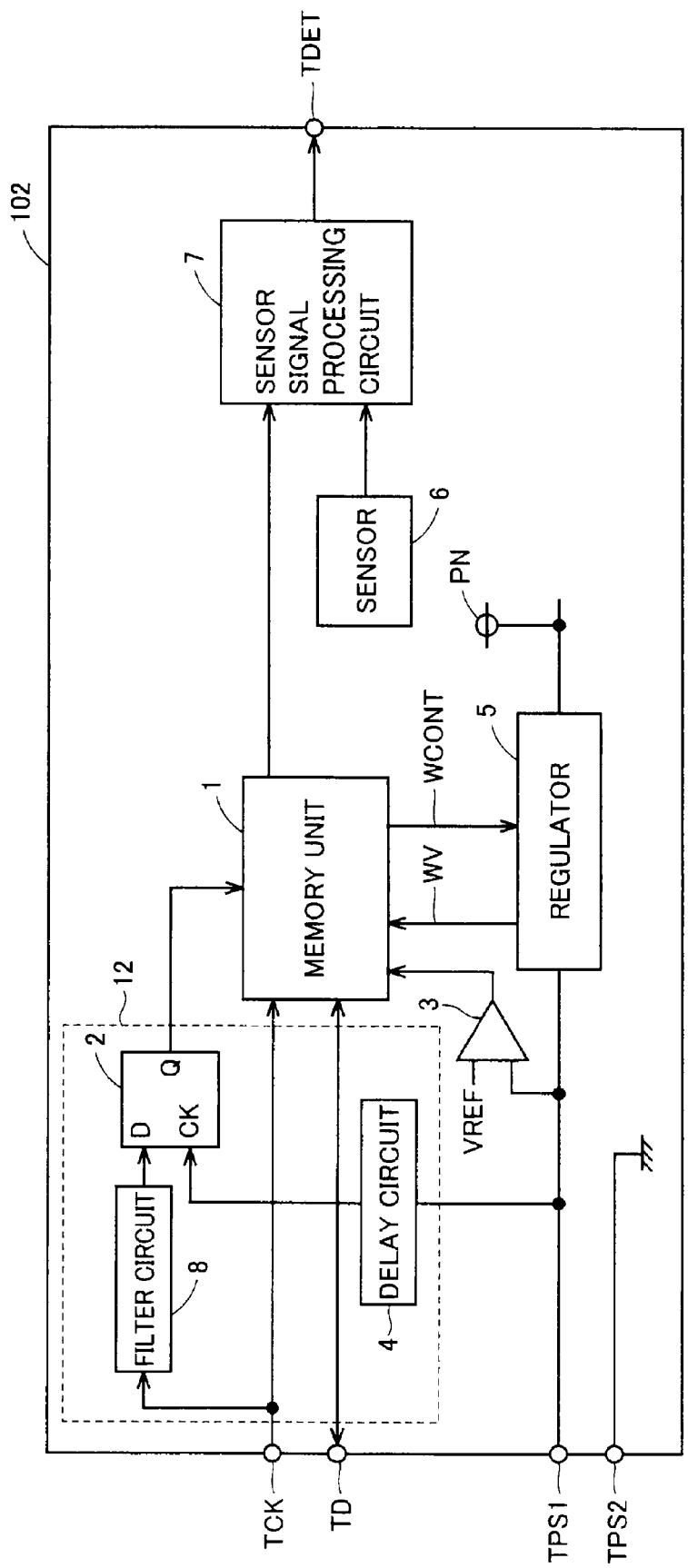
FIG. 3 shows a configuration of a semiconductor device according to a second embodiment of the present invention.

FIG. 3 shows a configuration of the semiconductor device according to a second embodiment of the present invention.

Referring to FIG. 3, a semiconductor device 102 includes a level detecting circuit 12 instead of level detecting circuit 11, when compared to the semiconductor device according to the first embodiment of the present invention. Level detecting circuit 12 includes flip flop 2, delay circuit 4 and a filter circuit 8.

Level detecting circuit 12 detects whether or not a situation in which a voltage level at control terminal TCK reaches a prescribed value or higher continues for a prescribed time period after a prescribed time period from when a power supply voltage is supplied to power supply terminal TPS1.

More specifically, filter circuit 8 is, for example, a low-pass filter. Filter circuit 8 attenuates a component that is not lower than a prescribed frequency among frequency components of a signal indicating a level of a voltage received by control terminal TCK, and outputs the attenuated signal to flip flop 2. Delay circuit 4 delays a signal indicating a level of the power supply voltage supplied to power supply terminal TPS1 by a prescribed time period, and outputs the delayed signal to flip flop 2. On the rising edge of the signal received from delay circuit 4, flip flop 2 holds the signal received from filter circuit 8, and in addition, outputs the signal to memory unit 1.

Figure 4:
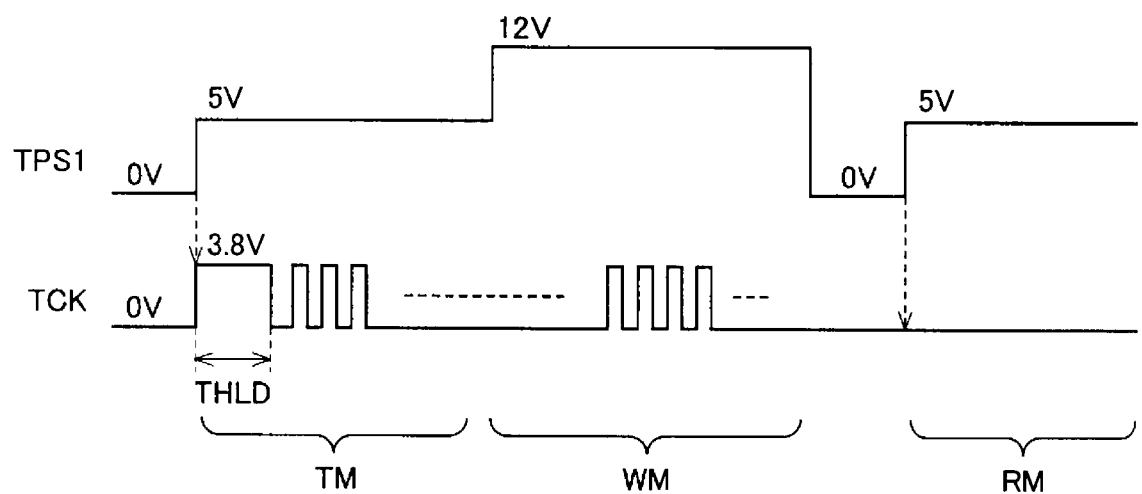
FIG. 4 is a timing chart of an operation when switching between operation modes is performed by the semiconductor device according to the second embodiment of the present invention.

FIG. 4 is a timing chart of an operation when switching between the operation modes is performed by the semiconductor device according to the second embodiment of the present invention.

Referring to FIG. 4, first, the power supply voltage of, for example, 5V is supplied to power supply terminal TPS1, and in addition, the voltage of, for example, 3.8V is supplied to control terminal TCK. At this time, regulator 5 steps down the power supply voltage of 5V supplied to power supply terminal TPS1, to generate internal power supply voltage IPS of 3.8V. Each block in semiconductor device 102 receives internal power supply voltage IPS as the operating power supply voltage.

In this case, if a situation in which the voltage level in control terminal TCK is set to, for example, 3.8V continues for a high hold time THLD, the voltage of 3.8V is provided from filter circuit 8 to flip flop 2. Furthermore, the rising edge of the power supply voltage is delayed by delay circuit 4 and conveyed to flip flop 2. On the rising edge conveyed from delay circuit 4, flip flop 2 holds the voltage of 3.8V received from filter circuit 8, and in addition, outputs the voltage to memory unit 1. Then, memory unit 1 selects adjustment mode TM.

Here, in a case where semiconductor device 102 operates in normal mode RM, the voltage in control terminal TCK may be set to a logic high level by disturbance noise immediately after power-on. As a result, semiconductor device 102 may accidentally operate in adjustment mode TM.

Therefore, the semiconductor device according to the second embodiment of the present invention is configured such that high hold time THLD is set to be equal to or longer than an assumed time period during which noise is generated, and switching to adjustment mode TM is performed only if the situation in which the voltage in control terminal TCK is set to a logic high level continues for high hold time THLD or longer. With such a configuration, a malfunction due to the noise can be prevented and the stable operation can be achieved.

Although the semiconductor device according to the second embodiment of the present invention is configured to include filter circuit 8, the present invention is not limited thereto. The semiconductor device may be configured to include, for example, a voltage pattern determining circuit. In other words, this voltage pattern determining circuit outputs a signal having a logic high level to flip flop 2 in a case where the signal received from control terminal TCK has a prescribed pattern, and outputs a signal having a logic low level to flip flop 2 in a case where the signal received from control terminal TCK does not have the prescribed pattern.

The configuration and the operation are otherwise the same as those of the semiconductor device according to the first embodiment, and therefore, detailed description thereof will not be repeated.

Although the present invention has been described and illustrated in detail, it is clearly understood that the same is by way of illustration and example only and is not to be taken by way of limitation, the scope of the present invention being interpreted by the terms of the appended claims.

What is claimed is:

1. A semiconductor device having a plurality of operation modes, comprising:
   a control terminal;
   a power supply terminal to which a power supply voltage is supplied;
   a first level detecting circuit for detecting a voltage level at said control terminal after a prescribed time period from when the power supply voltage is supplied to said power supply terminal;
   a control unit for selecting in which operation mode among said plurality of operation modes the semiconductor device operates, based on a result of detection by said first level detecting circuit; and a regulator for generating an internal power supply voltage based on the power supply voltage supplied to said power supply terminal, said first level detecting circuit and said control unit receiving said internal power supply voltage as an operating power supply voltage, and in an operation mode, among said plurality of operation modes, where a power supply voltage having a level different from that of a power supply voltage in other operation modes is supplied to said power supply terminal, said control unit performing data processing by using the power supply voltage supplied to said power supply terminal.

2. The semiconductor device according to claim 1, wherein said control unit includes a storage element for storing data in a non-volatile manner, and uses, as a write voltage for having the data stored in said storage element, the power supply voltage supplied to said power supply terminal, in said operation mode where the power supply voltage having a different level is supplied.

3. The semiconductor device according to claim 1, wherein said control unit selects in which operation mode among said plurality of operation modes the semiconductor device operates, and then, performs data processing by using a control signal received through said control terminal.

4. The semiconductor device according to claim 1, wherein said semiconductor device has first to third operation modes, and in said third operation mode, a power supply voltage having a level different from that of a power supply voltage in said first operation mode and in said second operation mode is supplied to said power supply terminal, the semiconductor device further comprising a second level detecting circuit for receiving said internal power supply voltage as the operating power supply voltage and detecting the level of the power supply voltage supplied to said power supply terminal, wherein said control unit selects whether the semiconductor device operates in said first operation mode or the semiconductor device operates in said second operation mode or said third operation mode, based on a result of detection by said first level detecting circuit, and in a case where the semiconductor device operates in said second operation mode or said third operation mode, said control unit selects whether the semiconductor device operates in said second operation mode or the semiconductor device operates in said third operation mode, based on a result of detection by said second level detecting circuit.

5. The semiconductor device according to claim 4, wherein after selection of the operation in said second operation mode or said third operation mode, said control unit performs data processing by using a control signal received through said control terminal.

6. The semiconductor device according to claim 4, wherein during the operation in said second operation mode, said control unit performs switching to said third operation mode when an absolute value of the voltage level detected by said second level detecting circuit reaches a prescribed value or higher, and said regulator steps down the power supply voltage supplied to said power supply terminal to less than said prescribed value, to generate the internal power supply voltage.

7. The semiconductor device according to claim 4, further comprising:

a data terminal for receiving adjustment data, a sensor; and a sensor signal processing circuit for adjusting a signal received from said sensor, wherein in said second operation mode, said control unit outputs said adjustment data received through said data terminal to said sensor signal processing circuit, in said third operation mode, said control unit stores said adjustment data received through said data terminal in a non-volatile manner, in said first operation mode, said control unit outputs said adjustment data stored in said third operation mode to said sensor signal processing circuit, and said sensor signal processing circuit adjusts the signal received from said sensor, based on the adjustment data received from said control unit.

8. The semiconductor device according to claim 7, wherein in said second operation mode and in said third operation mode, said control unit receives said adjustment data via said data terminal by using a control signal received through said control terminal.

9. The semiconductor device according to claim 7, wherein said control unit includes a storage element for storing data in a non-volatile manner, and uses, as a write voltage for having said adjustment data stored in said storage element, the power supply voltage supplied to said power supply terminal, in said third operation mode.

10. The semiconductor device according to claim 1, wherein said first level detecting circuit detects whether or not a situation in which the voltage level at said control terminal reaches a prescribed value or higher continues for a prescribed time period after the prescribed time period from when the power supply voltage is supplied to said power supply terminal.

* * * * *